United States Patent
Huang et al.

(10) Patent No.: US 9,449,839 B2
(45) Date of Patent: *Sep. 20, 2016

(54) SELF-ASSEMBLED MONOLAYER FOR PATTERN FORMATION

(71) Applicant: Taiwan Semiconductor Manufacturing Co., Ltd., Hsin-Chu (TW)

(72) Inventors: Tsung-Min Huang, Taichung (TW); Chung-Ju Lee, Hsinchu (TW); Chien-Hua Huang, Pingzhen (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/537,406

(22) Filed: Nov. 10, 2014

(65) Prior Publication Data

US 2015/0056813 A1 Feb. 26, 2015

Related U.S. Application Data

(63) Continuation-in-part of application No. 13/567,250, filed on Aug. 6, 2012, now Pat. No. 8,883,646.

(51) Int. Cl.
*H01L 21/033* (2006.01)
*H01L 21/311* (2006.01)
*H01L 21/768* (2006.01)

(52) U.S. Cl.
CPC ..... *H01L 21/31144* (2013.01); *H01L 21/0332* (2013.01); *H01L 21/0337* (2013.01); *H01L 21/0338* (2013.01); *H01L 21/76816* (2013.01)

(58) Field of Classification Search
USPC ........................................................ 438/694
See application file for complete search history.

(56) References Cited

U.S. PATENT DOCUMENTS

| 8,883,646 | B2 * | 11/2014 | Huang | ............. | H01L 21/76816 |
| | | | | | 257/E21.038 |
| 2006/0281266 | A1 | 12/2006 | Wells | | |
| 2007/0037101 | A1 | 2/2007 | Morioka | | |

(Continued)

FOREIGN PATENT DOCUMENTS

TW 200845127 A 11/2008

OTHER PUBLICATIONS

U.S. Appl. No. 13/567,250, filed Aug. 6, 2012.

(Continued)

*Primary Examiner* — Asok K Sarkar
(74) *Attorney, Agent, or Firm* — Eschweiler & Associates, LLC

(57) ABSTRACT

The present disclosure relates to a method of forming a pattern on a semiconductor substrate. One or more layers are formed over the semiconductor substrate. A first self-assembled monolayer (SAM) layer is formed over the one or more layers, wherein the first SAM layer exhibits a first SAM pattern. At least a first of the one or more layers is patterned using the first SAM layer as a first etch mask to form first pillars in the first of the one or more layers and then removing the first SAM layer. A second self-assembled monolayer (SAM) layer is formed along sidewall portions of the first pillars after the first SAM layer has been removed, wherein the second SAM layer exhibits a second SAM pattern that differs from the first SAM pattern and where the second SAM layer differs in material composition from the first SAM layer.

20 Claims, 6 Drawing Sheets

(56) References Cited

U.S. PATENT DOCUMENTS

| | | |
|---|---|---|
| 2007/0212892 A1 | 9/2007 | Caspary et al. |
| 2008/0122125 A1 | 5/2008 | Zhou |
| 2008/0274413 A1 | 11/2008 | Millward |
| 2009/0191713 A1 | 7/2009 | Yoon et al. |
| 2012/0009523 A1 | 1/2012 | Lee et al. |
| 2015/0021774 A1* | 1/2015 | Chiang .................. B82Y 30/00 257/751 |

OTHER PUBLICATIONS

Non-Final Office Action dated Aug. 27, 2013 for U.S. Appl. No. 13/567,250.

Final Office Action dated Jan. 27, 2014 for U.S. Appl. No. 13/567,250.

Notice of Allowance Dated Jul. 9, 2014 U.S. Appl. No. 13/567,250.

* cited by examiner ions, the device in
ed to the orientation depicted in the
paratus may be otherwise oriented (rotated 90
SELF-ASSEMBLED MONOLAYER FOR PATTERN FORMATION

REFERENCE TO RELATED APPLICATION

This Application is a continuation-in-part of U.S. application Ser. No. 13/567,250 filed on Aug. 6, 2012, and claims priority thereto. This Application hereby incorporates the contents of U.S. application Ser. No. 13/567,250 herein by reference.

BACKGROUND

A continuing trend in semiconductor technology is to build integrated circuits with more and/or faster semiconductor devices. As is often the case, however, as the devices shrink in size from one generation to the next, some of the existing fabrication techniques are not precise enough to be used in fabricating the next generation of integrated circuit devices. For example, spacers are used in conventional semiconductor devices to provide alignment of the source and drain regions to the gates in transistors. Minor differences in the uniformity and shape of the spacers can alter the operational characteristics of the device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
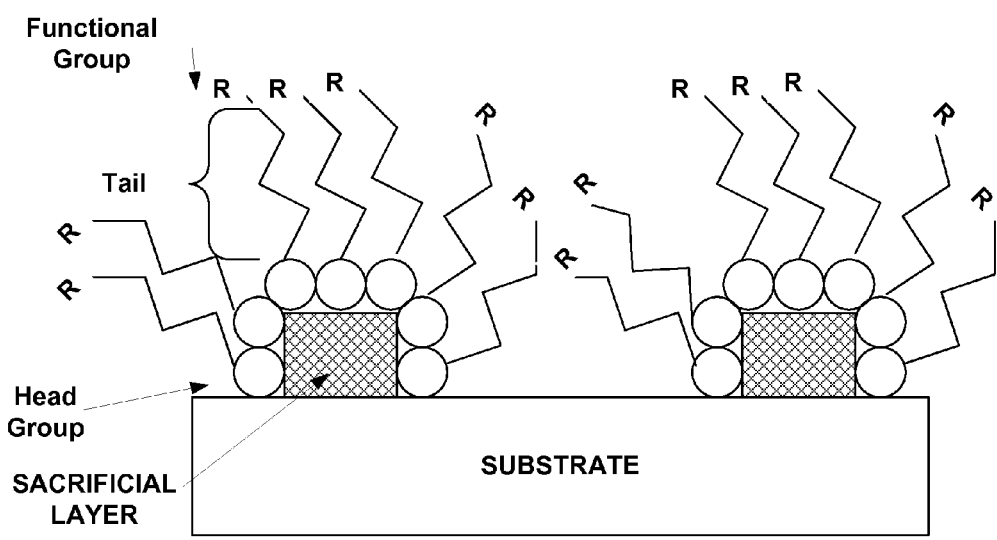
FIG. 1 is an illustration of an embodiment of a representation of a monolayer structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Features, such as conductive lines, are conventionally formed using a process in which a pattern defining the features is first formed in a temporary layer over a semiconductor substrate and subsequently transferred to the substrate using conventional etching chemistries. Photolithography is commonly used to pattern such features within a photodefinable (or photoresist) layer. In photolithography, a pattern of features is formed in the photodefinable layer using a process which includes directing light (or radiation) through a reticle having a pattern corresponding to the pattern of features to be formed in the substrate.

The sizes of features can be described by the concept of "pitch," which is defined as the distance between identical points in two neighboring features. These features are typically defined by spaces between adjacent features. Spaces are typically filled by a material, such as an insulator, to form "spacers". As a result, for regular patterns (e.g., in arrays), pitch can be viewed as the sum of the width of a feature and the width of the space on one side of the feature separating that feature from a neighboring feature. However, due to factors such as optics and light (or radiation) wavelength, photolithography techniques each have a minimum pitch below which a particular photolithographic technique cannot reliably form features. Consequently, the minimum pitch restriction of a given photolithographic technique is an impediment to further reduction in feature sizes.

Moreover, current deposition techniques, such as chemical vapor deposition (CVD) and atomic layer deposition (ALD), for application of pattern material do not provide uniformity in pattern shape owing to a faster rate of deposition of material at an upper portion of the pattern as opposed to a lower portion of the pattern, thereby causing non-uniformity. Additionally, CVD and ALD require high temperatures and are costly.

Accordingly, in some embodiments, the present disclosure is directed to a process for the fabrication of a semiconductor device in which a self-assembled monolayer (SAM) is used to form a patterned surface. This SAM can provide a uniform patterned surface exhibiting features sizes that are adequate for future generations. For example, in some embodiments, pitch between neighboring features can be on the order of thirty nanometers or less, for example, the neighboring features can be separated by between 10 nm and 50 nm, or between 20 nm and 50 nm, between 20 nm and 25 nm, or between 5 nm and 15 nm, among others.

In FIG. 1 there is illustrated a representation of a SAM which has been deposited on a sacrificial metal layer overlying a semiconductor substrate. The SAM comprises an organized layer of amphiphilic molecules in which one end of the molecule, the "head group" shows a specific, reversible affinity for a substrate. Generally, the head group is connected to an alkyl chain in which a tail or "terminal end" can be functionalized, for example, to vary wetting and interfacial properties. In one embodiment, the terminal end is functionalized to improve etch selectivity. Further, the carbon chain length (C-C)" of the alkyl chain will, in one embodiment, be adjustable to define critical dimension or minimum feature size, for example, to increase or decrease a width of the pattern. For example, the carbon chain length can be selected to be substantially equal to the minimum feature size of the semiconductor device. For some process technologies, longer carbon chains are chosen to result in a larger critical dimension or larger pitch, for example 64 nm, between neighboring devices. However, for other process technologies, shorter carbon chains are chosen to result in a smaller critical dimension or smaller pitch, for example 32 nm, between neighboring devices. Further, it will be appreciated that pitches of 64 nm and 32 nm are merely examples, and in other embodiments pitches are not constrained to these examples. By tailoring the bond lengths of the carbon chains used in this process, high resolution for various pitches can be achieved. For example, in some embodiments wider pitches, for example between 50 nm and 200 nm can be achieved, while in other embodiments narrower pitches, for example between 1 nm and 30 nm can be achieved.

Selection of the head group will depend on the application of the SAM, with the type of SAM compounds based on the substrate utilized. The head group may comprise, in one embodiment, an organosulfur compound, for example, din-alkyl sulfide,di-n-alkyl disulfides,3 thiophenols, mercapto-pyridines, mercaptoanilines, thiophenes, cysteines, xan-thates, thiocarbaminates, thiocarbamates, thioureas, mercaptoimidazoles, alkanethiols, and alkaneselenols. In one embodiment, the head group comprises a thiol, a chloride, or a fluoride. Substrates can include, for example, planar surfaces, such as silicon and metals, including copper, iron, silver, gold, nickel, platinum, palladium, and stainless steel; or curved surfaces, such as nanoparticles. In one embodiment, the substrate comprises a metal sacrificial layer.

FIGS. 2A-2I show a series of cross-sectional views illustrating an embodiment of a method of forming a semiconductor device. The process steps and structures below do not form a complete process flow for manufacturing integrated circuits and/or semiconductor devices. The present disclosure can be practiced in conjunction with integrated circuit fabrication techniques currently used in the art, and only so much of the commonly practiced process steps are included as are necessary for understanding the present disclosure. For purposes of understanding and clarity, this series of cross-sectional views has been streamlined in that other embodiments may include additional steps, and not all illustrated steps are present in all manufacturing flows. Hence, any number of variations are contemplated as falling within the scope of the present disclosure, and the disclosure is not limited to the examples illustrated or described herein.

Figure 2A:
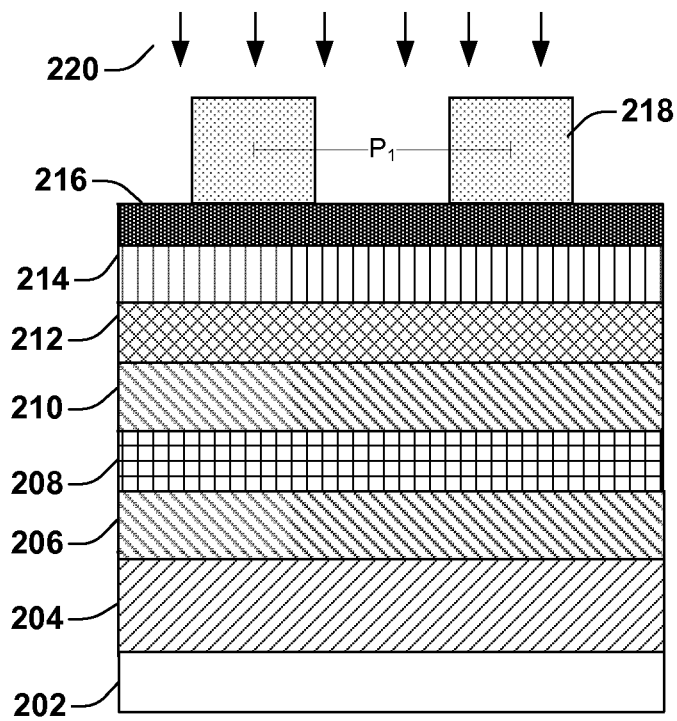
FIGS. 2A-2K illustrate a series of cross-sectional views of a method for forming a semiconductor device in accordance with an embodiment described herein.

Turning to FIG. 2A, there is illustrated a portion of a cross-section of a semiconductor wafer having a substrate 202 provided in the form of a bulk silicon wafer. Although FIG. 2A illustrates a bulk silicon wafer substrate, "semiconductor substrate" as referred to herein may comprise any type of semiconductor material including a bulk silicon wafer, a binary compound substrate (e.g., GaAs wafer), a ternary compound substrate (e.g., AlGaAs), or higher order compound wafers, among others. Further, the semiconductor substrate 202 can also include non semiconductor materials such as oxide or other insulator to implement a silicon-on-insulator (SOI) or partial SOI substrate. The substrate 202 can also include polysilicon, amorphous silicon, or organic materials, metal layers, or dielectric materials, among others. In some embodiments, the semiconductor substrate 202 can also include multiple wafers or dies which are stacked or otherwise adhered together. The semiconductor substrate 202 can include wafers which are cut from a silicon ingot, and/or any other type of semiconductor/non-semiconductor and/or deposited or grown (e.g. epitaxial) layers formed on an underlying substrate.

One or more layers to be patterned may be provided over the substrate 202 to form a patterned surface. The layers may include, for example, a target layer 204. The target layer 204 can take the form of a dielectric material, which can comprise a polysilicate glass (PSG), and in some embodiments, is formed on an upper surface of substrate 202. Target layer 204 can be applied, for example, using conventional chemical vapor deposition (CVD), spin-on techniques, or other like processes, and in accordance with some embodiments, can include silicon oxide, silicon nitride, or silicon-oxynitride, among others. Target layer 204 can be, in some embodiments, a low-κ dielectric. In some embodiments, target layer 204 is formed of low-κ dielectric materials with dielectric constants (κ value) between about 2.9 and 3.8. In other embodiments, target layer 204 is formed of ultra low-κ (ULK) dielectric materials, for example, with κ values less than about 2.5. In yet other embodiments, target layer 204 is formed of extreme low-κ (ELK) dielectric materials, for example, with κ values between about 2.5 and about 2.9. Such dielectrics include, for example, carbon-doped silicon dioxide, also referred to as organosilicate glass (OSG) and carbon-oxide. Low-κ materials may also include borophosphosilicate glass (BPSG), borosilicate glass (BSG), and phosphosilicate glass (PSG), among others. First and second transition layers 206, 210, respectively overlay target layer 204 and function to promote adhesion between target layer 204 and a subsequently formed sacrificial layer 212. An intermediary layer 208, which can be a conductive layer 208 comprising, for example, aluminum, copper, molybdenum, tantalum, titanium, tungsten, alloys, nitrides or silicides of such metals, may further be included. As will be appreciated in more detail herein, transition layer 210 can be a hardmask layer to facilitate patterning of conductive layer 208, and transition layer 206 can be an etch stop layer to act as an etch barrier when the conductive layer 208 is etched into the pattern.

The layers to be patterned can be formed by various techniques, for example, CVD such as plasma-enhanced CVD, low pressure CVD or epitaxial growth, physical vapor deposition (PVD) such as sputtering or evaporation, or electroplating, or other techniques. The thickness of the one or more layers to be patterned will vary depending on the materials and particular devices being formed.

Depending on the particular layers to be patterned, film thicknesses and photolithographic materials and process to be used, it may be desirable to dispose bottom 214 and top 216 antireflective coating (ARC) layers over the sacrificial layer 212, and to dispose a photoresist layer 216 over the ARC layers 214. Use of a sacrificial layer 212 may be desired, for example, with thin resist layers, where the layers to be etched require a significant etching depth, and/or where the particular etchant has poor resist selectivity. In one embodiment, where a sacrificial layer 212 is used, the resist patterns to be formed can be transferred to the sacrificial layer 212 which, in turn, can be used as a mask for etching underlying layers. Suitable sacrificial materials for layer 212 can include metals and oxides and nitrides thereof, for example, tungsten, titanium, titanium nitride, titanium oxide, zirconium oxide, aluminum oxide, aluminum oxynitride, hafnium oxide, amorphous carbon, silicon oxynitride and silicon nitride.

One or more antireflective coating layers 214, 216 may be desirable where the substrate 202 and/or underlying layers would otherwise reflect a significant amount of incident radiation during photoresist exposure such that the quality of the pattern formed would be adversely affected. Such coatings can improve depth of focus, exposure latitude, linewidth uniformity and CD control. Suitable antireflective materials including but not limited to: (1) organic antireflective coating (ARC) materials, such as but not limited to amorphous carbon anti-reflective coating (ARC) materials and organic polymer anti-reflective coating (ARC) materials (such as but not limited to polyimide organic polymer anti-reflective coating (ARC) materials, polysulfone anti-reflective coating (ARC) materials); and (2) silicon containing dielectric anti-reflective coating (ARC) materials, such as but not limited to silicon oxide anti-reflective coating (ARC) materials, silicon nitride anti-reflective coating (ARC) materials and silicon oxynitride anti-reflective coating (ARC) materials. In one embodiment, ARC layers 214, 216 formed from the same materials. In another embodiment, ARC layers 214, 216 can be formed from different materials.

Figure 2B:
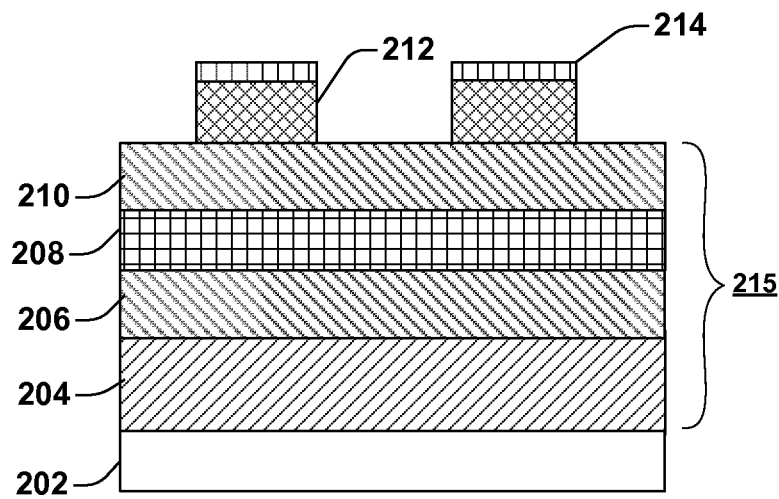

A photoresist layer 218 is applied on the substrate 202 over the antireflective layers 214, 216 and the sacrificial layer 212 is patterned 220. During patterning 220 and subsequent photoresist stripping, the photoresist layer 218 and top ARC layer 216 are consumed, leaving a portion of the bottom ARC layer 214 over the remaining sacrificial layer 212, as illustrated in FIG. 2B. The bottom ARC layer 214 is then removed by an ashing process. Removal of the bottom ARC layer 214 leaves a freestanding exposed patterned sacrificial layer 212. Thus, FIG. 2B illustrates a layer stack 215, which includes target layer 204, first transition layer 206, intermediary layer 208, and second transition layer 210.

Figure 2C:
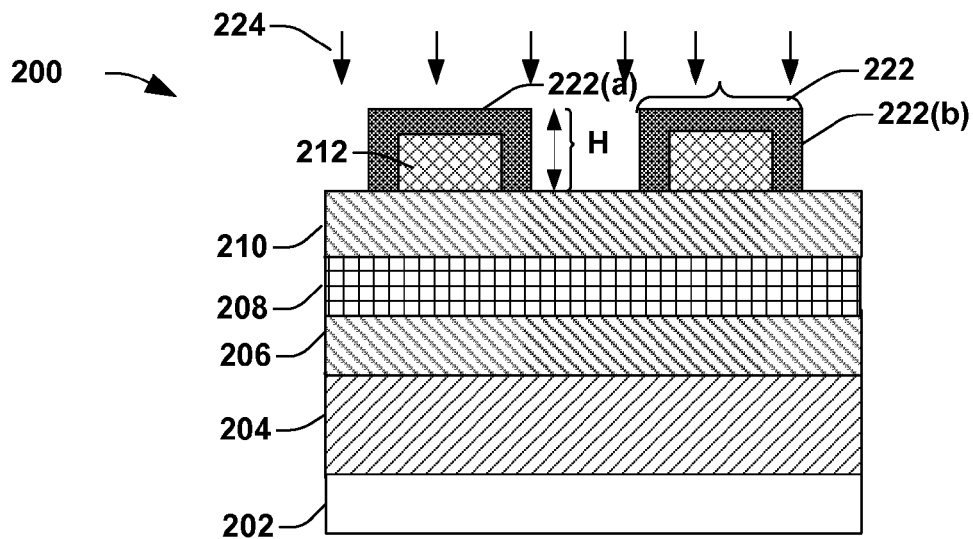

A first self-assembled monolayer (SAM) is deposited 224 over the patterned sacrificial layer 212 to form a first SAM cap 222(a) over an upper surface of the patterned sacrificial layer 212 and forming first SAM sidewalls 222(b) about the sidewalls of the patterned sacrificial layer 212, as illustrated in FIG. 2C. The first SAM cap and sidewalls 222(a), 222(b) are created by chemisorption of the hydrophilic head groups onto the sacrificial layer 212, followed by a slow two-dimensional organization of hydrophobic tail groups. SAM adsorption can occur from solution by immersion of the substrate into a dilute solution of, in one embodiment, an alkane thiol in ethanol. Adsorption may also occur from a vapor phase. The adsorbed molecules initially form a disordered mass of molecules, and instantaneously begin to form crystalline or semicrystalline structures on the sacrificial layer 212 in a first monolayer. Owing to the affinity of the head group of the SAM to the metal of the sacrificial layer 212, the first SAM cap and sidewalls 222(a), 222(b) will selectively deposit on the sacrificial layer 212, forming a metal complex and the first SAM will not react with a nitride transition layer 210 on which the sacrificial layer 212 is directly disposed. The first SAM may be deposited via spin-coating from a solution of, for example, an alkane thiol in ethanol, among others. The SAM can be conformally formed, in one embodiment, at a thickness of about 16 nm so that first SAM cap 222(a) and first SAM sidewalls 222(b) are of equal thickness. It will be understood, however, that this first SAM thickness can be adjusted by adjusting the carbon chain length of the alkyl chain used is used to form the first SAM.

Figure 2D:
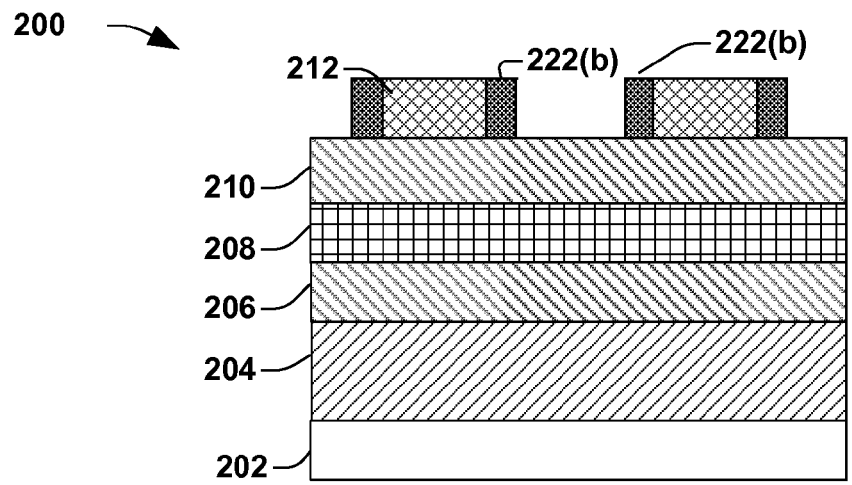
Figure 2E:
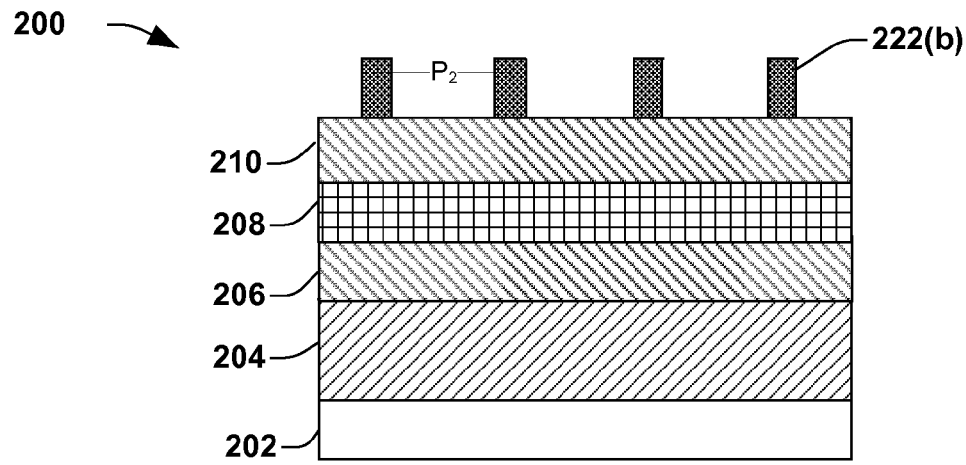

Following deposition of the first SAM 222, an etch is performed to remove the first SAM cap 222(a) portion of the SAM overlying the sacrificial layer 212 to expose the upper surface of the patterned sacrificial layer 212 so that only first SAM sidewalls 222(b) remain in place, as illustrated in FIG. 2D. Height (H) of the first SAM sidewalls 222(b) is dependent upon the height of the sacrificial layer 212 and can be adjusted accordingly. In one embodiment height (H) can be about 330 Angstroms. Following removal of the first SAM cap 222(b), the patterned sacrificial layer 212 can be removed by an etch or wet strip process (not shown), with the first SAM sidewalls 222(b) then forming a first pattern arrangement which has been directed by the patterned sacrificial layer 212, as illustrated in FIG. 2E.

Figure 2F:
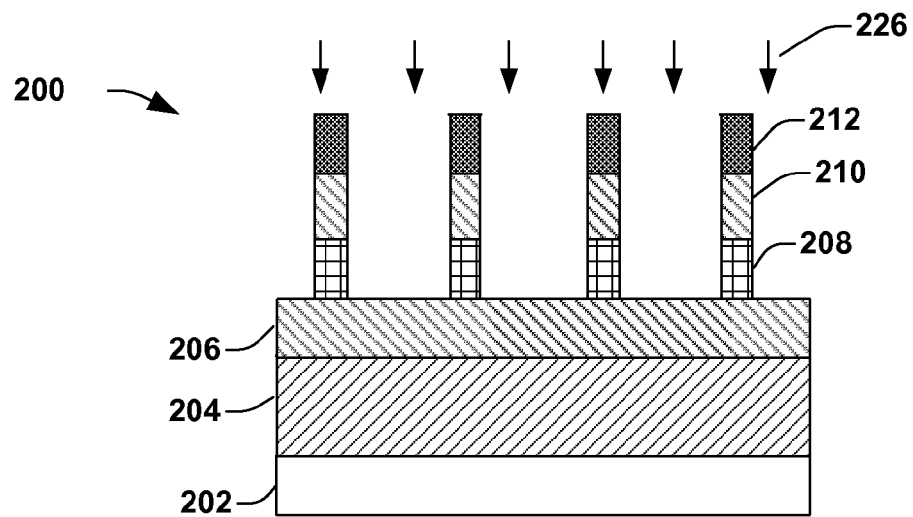
Figure 2G:
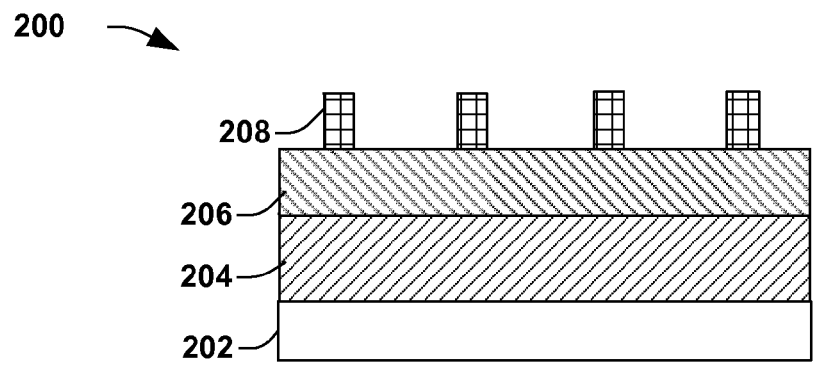

An etch process 226 is next performed in FIG. 2F to remove conductive layer 208 and is stopped at first transition layer 206, which acts as an etch stop for this etch process 226. First transition layer 210 and first pattern arrangement 222(b) are then removed by an etch process to form a second pattern directed by the first pattern arrangement 222(b) in FIG. 2G.

Figure 2H:
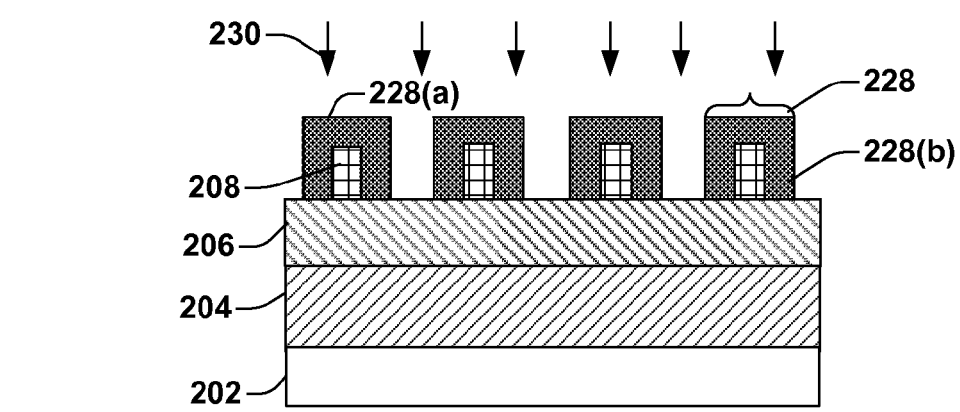

In FIG. 2H, a second or additional self-assembling monolayer 228 is deposited 230 over the second pattern formed by the conductive layer 208 to form a second SAM cap 228(a) over an upper surface of the conductive layer 208 and to form second SAM sidewalls 228(b) about sidewalls of the conductive layer 208.

Figure 2I:
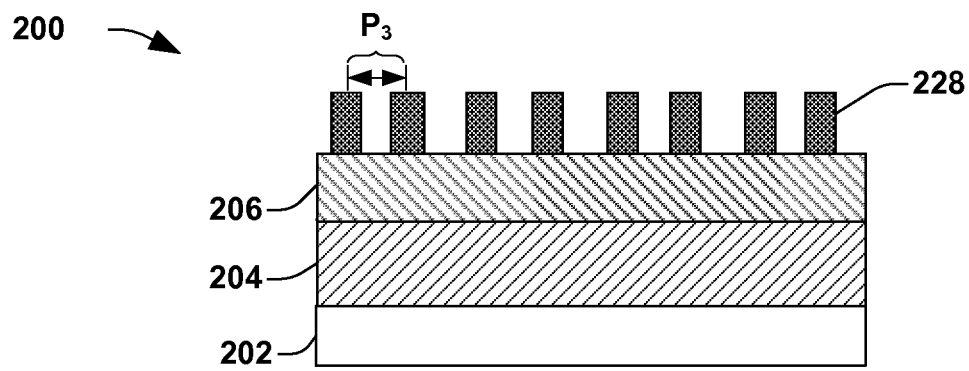

Following deposition of the second SAM 228, the second SAM cap portion 228(a) is removed, exposing an upper surface of the second pattern formed by the conductive layer 208, leaving the second SAM sidewalls 228(b) in place to form a second pattern arrangement of 228, directed by the pattern created by the first pattern arrangement of as illustrated in FIG. 2I.

Figure 2J:
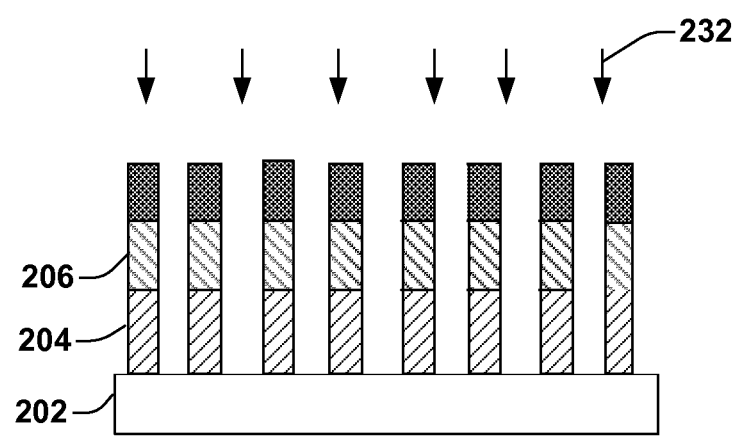
Figure 2K:
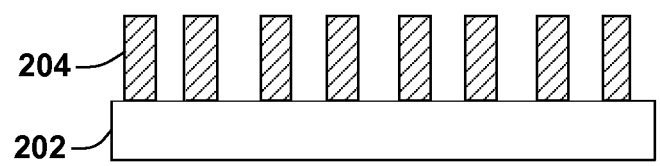

In FIG. 2J, an etch process 230 is performed to remove transition layer 206 and pattern dielectric layer 204. Patterning process is completed in FIG. 2K, with dielectric layer 204 remaining.

Owing to the process disclosed herein, the semiconductor device 200 of FIG. 2I is provided with a second pattern arrangement which has a pitch of one-half of the first pattern arrangement. Thus, for example, beginning with a first pattern arrangement having a first pitch $P_1$ of 128 nanometers (nm) in FIG. 2A, the disclosed process can reduce the first pitch by one-half to a second pitch $P_2$ of 64 nm in FIG. 2E. The pitch of the second pattern arrangement is then reduced by one-half in a third pattern having a third pitch P3 of 32 nm in FIG. 2I. It will be understood, then, that it is within the scope of the present disclosure to deposit additional self-assembled monolayers to further decrease pitch. For example, a fourth pattern having a fourth pitch of 16 nm could be formed by using a third SAM layer, a fifth pattern having a fifth pitch of 8 nm could be formed by using a fifth SAM layer; and so on. Each SAM layer can use a different SAM material with different carbon chain lengths corresponding to the minimum feature size of each SAM layer. For example, a first carbon chain (N carbon bonds in length) can be chosen for the material of the first SAM to correspond to 64 nm pitch; a second carbon chain (N/2 carbon bonds in length) can be chosen for the material of the second SAM to correspond to 32 nm pitch; a third carbon chain (N/4 carbon bonds in length) can be chosen for the material of the third SAM to correspond to 16 nm pitch; and so on. These SAM patterns can thus be used as etch mask to etch layers disposed over a semiconductor substrate (e.g., layers 204, 206, 208, 210 in FIG. 2A) or can also be used to etch the semiconductor substrate itself. The pitch of the spacers can then be approximated by a factor of $\frac{1}{2}^N$ of a minimum feature size on the semiconductor device which was resolved by photolithography, where N is a positive integer. In some embodiments, N can be on the order of several hundred, but can also be on the order of tens, or on the order of several thousands. For example, if a carbon bond length is approximately 150 pm and a pitch of 16 nm is to be achieved, N could be on the order of 16 nm/150 pm=10.7 carbon bond lengths. Of course, because of bond angle between adjacent carbon atoms, N may be larger than 10.7 in this example, and if aromatics are considered N may increase markedly.

Figure 3:
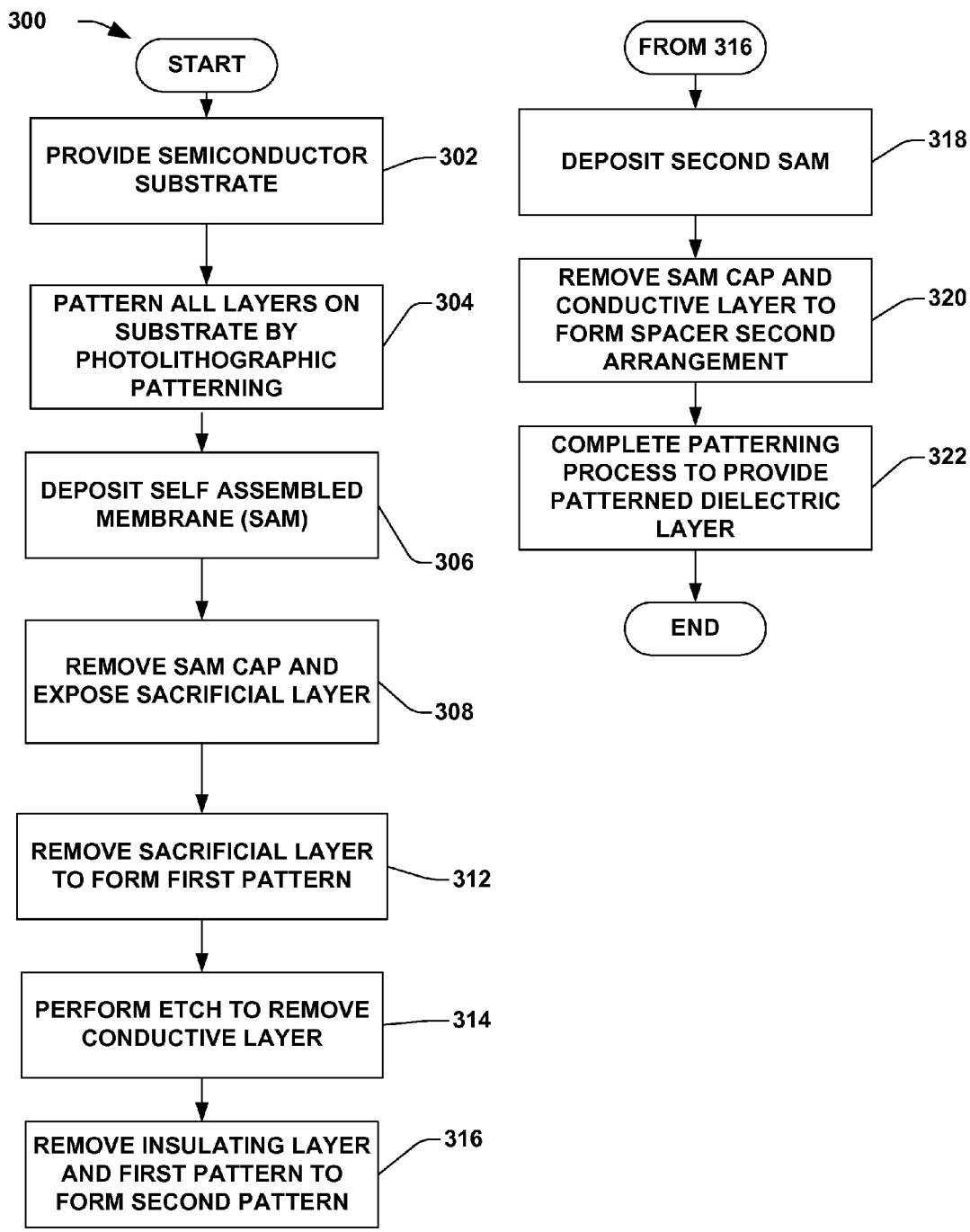
FIG. 3 illustrates a flow diagram of a method for forming a semiconductor device in accordance with an embodiment described herein.

FIG. 3 illustrates a flow diagram of a method of forming a semiconductor device in accordance with some embodiments of the disclosure. While this method and other methods disclosed herein may be illustrated and/or described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases.

As illustrated in FIG. 3, method 300 begins at step 302 wherein a semiconductor substrate is provided having layers thereon to be patterned.

In step 304, photolithographic patterning is performed to pattern layers on the substrate.

A SAM is deposited by spin coating at step 306 over the upper surface and sidewalls of the sacrificial layer to form a SAM cap and SAM sidewalls.

In step 308, the SAM cap is removed and the sacrificial layer is exposed which is then removed by an etch and/or wet strip process to form a first pattern arrangement in step 312

The conductive layer is then patterned by etching, utilizing the first pattern arrangement in step 314.

The transition layer and first pattern are removed by step 316. In step 318 a second SAM is deposited over the upper surface and sidewalls of the conductive layer to form a SAM cap and SAM sidewalls.

The SAM cap and the conductive layer are then removed in step 320 by an etch and/or wet strip process to form a second arrangement. The patterning process is then completed in step 320 by etching of the transition layer into the low-k dielectric to pattern the dielectric layer, and the process ends.

Therefore, the disclosure relates to a method of forming a pattern on a semiconductor substrate. One or more layers are formed over the semiconductor substrate. A first self-assembled monolayer (SAM) layer is formed over the one or more layers, wherein the first SAM layer exhibits a first SAM pattern. At least a first of the one or more layers is patterned using the first SAM layer as a first etch mask to form first pillars in the first of the one or more layers and then removing the first SAM layer. A second self-assembled monolayer (SAM) layer is formed along sidewall portions of the first pillars after the first SAM layer has been removed, wherein the second SAM layer exhibits a second SAM pattern that differs from the first SAM pattern and where the second SAM layer differs in material composition from the first SAM layer.

In another embodiment, the disclosure relates to a method of fabricating a semiconductor device. A patterned layer is formed over a semiconductor substrate. A first self-assembled monolayer (SAM) is formed on sidewalls of the patterned layer to form a first pattern arrangement in which neighboring features are spaced at a first pitch. The first SAM is made up of a first organic material exhibiting a first carbon chain that is N carbon bonds in length, wherein N is an integer. A second SAM is formed over the first pattern arrangement to form a second pattern arrangement. In this second pattern arrangement, neighboring features are spaced at a second pitch which is less than the first pitch. The second SAM is made up of a second organic material exhibiting a second carbon chain that is less than N carbon bonds in length.

In a still further embodiment, the disclosure relates to a method of forming a pattern on a semiconductor substrate. A patterned sacrificial layer is formed overlying an intermediate layer stack, wherein the intermediate layer stack overlies the semiconductor substrate. A first self-assembled monolayer (SAM) is formed on sidewalls of the patterned sacrificial layer. The patterned sacrificial layer is removed while the first SAM sidewalls are left in place, wherein the first SAM sidewalls define a first pattern arrangement. At least one layer of the intermediate layer stack is patterned using the first SAM sidewalls as a first etch mask to form pillars in the at least one layer of the intermediate layer stack and then removing the first SAM sidewalls. A second self-assembled monolayer (SAM) is formed on sidewalls of the pillars after the first SAM sidewalls are removed. The pillars are removed while second SAM sidewalls are left in place, such that the second SAM sidewalls define a second pattern arrangement. The second pattern arrangement differs from the first pattern arrangement and the second SAM layer differs in material composition from the first SAM layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a pattern on a semiconductor substrate, comprising:
   forming one or more layers over the semiconductor substrate;
   forming a first self-assembled monolayer (SAM) layer over the one or more layers, wherein the first SAM layer exhibits a first SAM pattern;
   patterning at least a first of the one or more layers using the first SAM layer as a first etch mask to form first pillars in the first of the one or more layers and then removing the first SAM layer; and
   forming a second self-assembled monolayer (SAM) layer along sidewall portions of the first pillars after the first SAM layer has been removed, wherein the second SAM layer exhibits a second SAM pattern that differs from the first SAM pattern and where the second SAM layer differs in material composition from the first SAM layer.

2. The method of claim 1, further comprising:
   removing the first pillars while leaving the second SAM layer in place; and
   using the second SAM pattern as a second etch mask to form second pillars in either the substrate or in a second of the one or more layers.

3. The method of claim 1, wherein the first SAM pattern includes a first series of regularly spaced openings which are spaced according to a first pitch.

4. The method of claim 3, wherein the second SAM pattern includes a second series of regularly spaced openings which are spaced according to a second pitch that is less than the first pitch.

5. The method of claim 1, wherein the first SAM is made up of a first organic material exhibiting a first carbon chain that is N carbon bonds in length, and wherein the second SAM is made up of a second organic material exhibiting a second carbon chain that is less than N carbon bonds in length.

6. The method of claim 5, wherein the length of the first carbon chain corresponds to a first pitch between features of the first SAM pattern, and wherein the length of the second carbon chain corresponds to a second pitch in the second SAM pattern.

7. The method of claim 1, wherein a pitch of the second SAM pattern is one-half a pitch of the first SAM pattern.

8. A method of fabricating a semiconductor device, comprising:
providing a patterned layer over a semiconductor substrate;
forming a first self-assembled monolayer (SAM) on sidewalls of the patterned layer to form a first pattern arrangement in which neighboring features are spaced at a first pitch, wherein the first SAM is made up of a first organic material exhibiting a first carbon chain that is N carbon bonds in length, wherein N is an integer; and
forming a second SAM over the first pattern arrangement to form a second pattern arrangement in which neighboring features are spaced at a second pitch which is less than the first pitch and wherein the second SAM is made up of a second organic material exhibiting a second carbon chain that is less than N carbon bonds in length.

9. The method of claim 8, further comprising:
patterning a first layer over the semiconductor substrate using the first SAM layer as a first etch mask to form first pillars in the first layer and then removing the first SAM layer; and
wherein the second SAM is formed along sidewalls of the first pillars to form the second pattern arrangement.

10. The method of claim 9, further comprising:
removing the first pillars while leaving the second SAM layer in place; and
using the second SAM pattern as a second etch mask to form second pillars in either a second layer underlying the first layer or in the substrate.

11. The method of claim 8, wherein a pitch of the second SAM pattern is one-half a pitch of the first SAM pattern arrangement and wherein the second carbon chain is N/2 carbon bonds in length.

12. A method of forming a pattern on a semiconductor substrate, comprising:
forming a patterned sacrificial layer overlying an intermediate layer stack, wherein the intermediate layer stack overlies the semiconductor substrate;
forming a first self-assembled monolayer (SAM) on sidewalls of the patterned sacrificial layer;
removing the patterned sacrificial layer while leaving first SAM sidewalls in place, wherein the first SAM sidewalls define a first pattern arrangement;
patterning at least one layer of the intermediate layer stack using the first SAM sidewalls as a first etch mask to form pillars in the at least one layer of the intermediate layer stack and then removing the first SAM sidewalls;
forming a second self-assembled monolayer (SAM) on sidewalls of the pillars after the first SAM sidewalls are removed; and
removing the pillars while leaving second SAM sidewalls in place such that the second SAM sidewalls define a second pattern arrangement, wherein the second pattern arrangement differs from the first pattern arrangement and wherein the second SAM layer differs in material composition from the first SAM layer.

13. The method of claim 12, further comprising patterning at least one other layer of the intermediate layer stack using the second SAM sidewalls as a second etch mask.

14. The method of claim 12, wherein a pitch of the second pattern arrangement is twice a pitch of the first pattern arrangement.

15. The method of claim 12, further comprising forming first SAM top portions on top of the patterned sacrificial layer concurrently with the forming of the first SAM sidewalls, thereby defining first SAM caps on top of the patterned sacrificial layer.

16. The method of claim 15, further comprising removing the first SAM caps prior to removing the patterned sacrificial layer.

17. The method of claim 12, further comprising forming second SAM top portions on top of the pillars concurrently with the forming of the second SAM sidewalls, thereby defining second SAM caps on top of the pillars.

18. The method of claim 17, further comprising removing the second SAM caps prior to removing the pillars.

19. The method of claim 12, wherein the sacrificial layer comprises a metal and a head group of the self-assembled monolayer is specific to the metal.

20. The method of claim 19, wherein the first SAM, when deposited, selectively deposits on the sacrificial layer without forming on the intermediate layer stack.

* * * * *